(12) United States Patent
Nakamura

(10) Patent No.: US 10,639,724 B2
(45) Date of Patent: May 5, 2020

(54) COATED CUTTING TOOL

(71) Applicant: TUNGALOY CORPORATION, Fukushima (JP)

(72) Inventor: Takaaki Nakamura, Iwaki (JP)

(73) Assignee: TUNGALOY CORPORATION, Fukushima (JP)

( * ) Notice: Subject to any disclaimer, the term of this patent is extended or adjusted under 35 U.S.C. 154(b) by 149 days.

(21) Appl. No.: 16/077,649

(22) PCT Filed: Feb. 8, 2017

(86) PCT No.: PCT/JP2017/004638
§ 371 (c)(1),
(2) Date: Aug. 13, 2018

(87) PCT Pub. No.: WO2017/141797
PCT Pub. Date: Aug. 24, 2017

(65) Prior Publication Data
US 2019/0047055 A1    Feb. 14, 2019

(30) Foreign Application Priority Data

Feb. 18, 2016   (JP) .................................. 2016-028477

(51) Int. Cl.
*B23B 27/14*     (2006.01)
*C23C 16/40*     (2006.01)
*C23C 30/00*     (2006.01)
*C23C 28/04*     (2006.01)

(52) U.S. Cl.
CPC ............ *B23B 27/148* (2013.01); *B23B 27/14* (2013.01); *C23C 16/40* (2013.01); *C23C 16/403* (2013.01); *C23C 28/042* (2013.01); *C23C 28/044* (2013.01); *C23C 28/048* (2013.01); *C23C 30/005* (2013.01); *B23B 2222/28* (2013.01); *B23B 2224/04* (2013.01); *B23B 2224/32* (2013.01); *B23B 2224/36* (2013.01); *B23B 2226/18* (2013.01); *B23B 2228/04* (2013.01)

(58) Field of Classification Search
USPC ........... 51/307, 309; 428/336, 698, 701, 702
See application file for complete search history.

(56) References Cited

U.S. PATENT DOCUMENTS

| 2008/0187774 A1 | 8/2008 | Ruppi |
| 2012/0015148 A1 | 1/2012 | Ruppi |
| 2014/0173996 A1 | 6/2014 | Stiens et al. |
| 2014/0193624 A1 | 7/2014 | Stiens et al. |
| 2015/0003925 A1 | 1/2015 | Östlund et al. |
| 2016/0175940 A1 | 6/2016 | Lindahl et al. |
| 2017/0209936 A1 | 7/2017 | Kanaoka et al. |

FOREIGN PATENT DOCUMENTS

| JP | 2004-299021 A | | 10/2004 |
| JP | 2007-125686 A | | 5/2007 |
| JP | 2008-246664 A | | 10/2008 |
| JP | 2014-530112 A | | 11/2014 |
| JP | 2015-009358 A | | 1/2015 |
| JP | 5872746 B1 | | 3/2016 |
| JP | 2016-137564 A | | 8/2016 |
| KR | 20150004306 | * | 1/2015 |

OTHER PUBLICATIONS

International Preliminary Report on Patentability and Written Opinion issued in PCT/JP2017/004638; dated Aug. 21, 2018.
International Search Report issued in PCT/JP2017/004638; dated Apr. 25, 2017.

* cited by examiner

*Primary Examiner* — Archene A Turner
(74) *Attorney, Agent, or Firm* — Studebaker & Brackett PC

(57) ABSTRACT

A coated cutting tool comprising a substrate and a coating layer formed on a surface of the substrate, wherein: the coating layer comprises at least one α-type aluminum oxide layer; and, in the α-type aluminum oxide layer, when regarding a texture coefficient of a (0,0,6) plane as a TC18 (0,0,6), and also regarding a texture coefficient of a (0,0,12) plane as a TC18 (0,0,12), the TC18 (0,0,6) is the highest texture coefficient and the TC18 (0,0,12) is the second highest texture coefficient.

20 Claims, No Drawings

COATED CUTTING TOOL

TECHNICAL FIELD

The present invention relates to a coated cutting tool.

BACKGROUND ART

Conventionally, a coated cutting tool formed by depositing, through chemical vapor deposition, a coating layer with a thickness of from 3 μm or more to 20 μm or less onto a surface of a substrate comprised of a cemented carbide, is well known for being used for the cutting of steel, cast iron, etc. An example of the above coating layer is a coating layer comprised of a single layer of one kind selected from the group consisting of a Ti carbide, a Ti nitride, a Ti carbonitride, a Ti carboxide, a Ti carboxynitride and aluminum oxide, or comprised of multiple layers of two or more kinds selected therefrom.

Patent Document 1 discloses a cutting tool in which, on a surface of a tool substrate made of a WC group cemented carbide or TiCN group cermet, a Ti compound layer is formed as a lower layer and an $Al_2O_3$ layer is provided as an upper layer, the $Al_2O_3$ layer having an α-type crystalline structure and showing an X-ray diffraction chart which shows clear diffraction peaks on a (006) plane and a (018) plane in an X-ray diffraction measurement.

CITATION LIST

Patent Documents

Patent Document 1: JP2004-299021 A

SUMMARY

Technical Problem

An increase in speed, feed and depth of cut have become conspicuous in cutting in recent times, which has led to the tendency of the tool life to become shorter than that involved in the prior art. Against such background, the tool disclosed in Patent Document 1 above has insufficient thermal shock resistance and wear resistance in high-speed intermittent machining, and the life thereof is therefore required to be further improved. In particular, as to the tool disclosed in Patent Document 1, wear progresses therein because of scraped off particles of an α-type aluminum oxide layer, thereby leading to the problem of a reduction in the wear resistance of such tool.

The present invention has been made in order to solve these problems, and an object of the present invention is to provide a coated cutting tool which has excellent wear resistance and thermal shock resistance and which accordingly has a long tool life.

Solution to Problem

The present inventor has conducted studies regarding extending the tool life of a coated cutting tool from the above-described perspective. As a result, the inventor has found that, when predetermined configurations are obtained by optimizing the crystal orientation of an α-type aluminum oxide layer in a coated cutting tool, this does not cause an impairment of wear resistance and can achieve an improvement of thermal shock resistance. The inventor has then found that the tool life of the coated cutting tool can be extended with excellent wear resistance and thermal shock resistance, and this has led to the completion of the present invention.

Namely, the gist of the present invention is as set forth below:

[1] A coated cutting tool comprising a substrate and a coating layer formed on a surface of the substrate, wherein: the coating layer comprises at least one α-type aluminum oxide layer; and, in the α-type aluminum oxide layer, when regarding a "texture coefficient of a (0,0,6) plane," which is represented by formula (1) below, as being denoted as a "TC18 (0,0,6)," and also regarding a "texture coefficient of a (0,0,12) plane," which is represented by formula (2) below, as being denoted as a "TC18 (0,0,12)," the TC18 (0,0,6) is the highest texture coefficient and the TC18 (0,0,12) is the second highest texture coefficient from among texture coefficients of eighteen crystal planes of the α-type aluminum oxide layer which are set forth below.

[Equation 1]

$$TC18(0, 0, 6) = \frac{I(0, 0, 6)}{I_0(0, 0, 6)} \left\{ \frac{1}{18} \Sigma \frac{I(h, k, l)}{I_0(h, k, l)} \right\}^{-1} \quad (1)$$

[Equation 2]

$$TC18(0, 0, 12) = \frac{I(0, 0, 12)}{I_0(0, 0, 12)} \left\{ \frac{1}{18} \Sigma \frac{I(h, k, l)}{I_0(h, k, l)} \right\}^{-1} \quad (2)$$

(In formulae (1) and (2), I (h,k,l) denotes a peak intensity for an (h,k,l) plane in X-ray diffraction of the α-type aluminum oxide layer, $I_0$ (h,k,l) denotes a standard diffraction intensity for an (h,k,l) plane which is indicated on JCPDS Card No. 10-0173 for α-type aluminum oxide, and (h,k,l) refers to the eighteen crystal planes of (0,1,2), (1,0,4), (1,1,0), (0,0,6), (1,1,3), (2,0,2), (0,2,4), (1,1,6), (0,1,8), (2,1,4), (3,0,0), (1,0,10), (0,2,10), (0,0,12), (0,1,14), (2,0,14), (1,1,15) and (1,0,16).)

[2] The coated cutting tool according to [1], wherein, in the α-type aluminum oxide layer, when regarding a texture coefficient of a (0,1,14) plane as a TC18 (0,1,14), as represented by formula (3) below, the TC18 (0,1,14) is the third highest texture coefficient from among the coefficients of the eighteen crystal planes of the α-type aluminum oxide layer.

[Equation 3]

$$TC18(0, 1, 14) = \frac{I(0, 1, 14)}{I_0(0, 0, 14)} \left\{ \frac{1}{18} \Sigma \frac{I(h, k, l)}{I_0(h, k, l)} \right\}^{-1} \quad (3)$$

(In formula (3), I (h,k,l), $I_0$ (h,k,l) and (h,k,l) respectively refer to those set forth above with regard to formulae (1) and (2).)

[3] The coated cutting tool according to [1] or [2], wherein the TC18 (0,0,6) is from 7.50 or more to 14.00 or less.

[4] The coated cutting tool according to any of [1] to [3], wherein the TC18 (0,0,12) is from 2.00 or more to 5.00 or less.

[5] The coated cutting tool according to any of [1] to [4], wherein the TC18 (0,1,14) is from 0.80 or more to 2.50 or less.

[6] The coated cutting tool according to any of [1] to [5], wherein an average thickness of the α-type aluminum oxide layer is from 1.0 μm or more to 15 μm or less.

[7] The coated cutting tool according to any of [1] to [6], wherein the coating layer comprises, between the substrate and the α-type aluminum oxide layer, a Ti compound layer containing a Ti compound of a Ti element and an element of at least one kind selected from the group consisting of C, N, O and B.

[8] The coated cutting tool according to [7], wherein an average thickness of the Ti compound layer is from 2.0 μm or more to 20 μm or less.

[9] The coated cutting tool according to any of [1] to [8], wherein an average thickness of the coating layer is from 3.0 μm or more to 30 μm or less.

[10] The coated cutting tool according to any of [1] to [9], wherein the substrate is a cemented carbide, cermet, ceramic or a cubic boron nitride sintered body.

Advantageous Effects of Invention

The present invention can provide a coated cutting tool which has excellent wear resistance and thermal shock resistance and which accordingly has a long tool life.

DESCRIPTION OF EMBODIMENTS

An embodiment for carrying out the present invention (hereinafter simply referred to as the "present embodiment") will hereinafter be described in detail. However, the present invention is not limited to the present embodiment below. Various modifications may be made to the present invention without departing from the gist of the invention.

A coated cutting tool according to the present embodiment comprises a substrate and a coating layer formed on a surface of the substrate. Specific examples of types of the coated cutting tool include an indexable cutting insert for milling or turning, a drill and an end mill.

The substrate in the present embodiment is not particularly limited, as long as it may be used as a substrate for the coated cutting tool. Examples of such substrate include a cemented carbide, cermet, ceramic, a cubic boron nitride sintered body, a diamond sintered body and high-speed steel. From among the above examples, the substrate is further preferably comprised of a cemented carbide, cermet, ceramic or a cubic boron nitride sintered body, as this provides excellent wear resistance and fracture resistance.

It should be noted that the surface of the substrate may be modified. For instance, when the substrate is comprised of a cemented carbide, a β-free layer may be formed on the surface thereof, and when the substrate is comprised of cermet, a hardened layer may be formed on the surface thereof. The effects of the present invention are still provided, even if the substrate surface has been modified in this way.

The average thickness of the coating layer in the present embodiment is preferably from 3.0 μm or more to 30 μm or less. If the average thickness of the coating layer is 3.0 μm or more, this indicates the tendency of the wear resistance to be further improved. Meanwhile, if the average thickness thereof is 30 μm or less, this indicates the tendency of the adhesion of the coating layer with the substrate and the fracture resistance to be further increased. From the same perspective, the average thickness of the coating layer is further preferably from 3.0 μm or more to 20 μm or less.

The coating layer in the present embodiment includes at least one α-type aluminum oxide layer. In the α-type aluminum oxide layer, when regarding a texture coefficient of a (0,0,6) plane, which is represented by formula (1) below, as being denoted as a TC18 (0,0,6), and also regarding a texture coefficient of a (0,0,12) plane, which is represented by formula (2) below, as being denoted as a TC18 (0,0,12), if the TC18 (0,0,6) is the highest texture coefficient and if the TC18 (0,0,12) is the second highest texture coefficient, this leads to excellent wear resistance and thermal shock resistance. A higher TC18 (0,0,6) of the α-type aluminum oxide layer leads to more excellent wear resistance and thermal shock resistance and particularly leads to remarkably excellent thermal shock resistance. Further, a higher TC18 (0,0,12) of the α-type aluminum oxide layer leads to more excellent wear resistance and thermal shock resistance and particularly leads to remarkably excellent wear resistance. Therefore, the coated cutting tool of the present embodiment is excellent in terms of thermal shock resistance and wear resistance compared with a conventional coated cutting tool.

[Equation 4]

$$TC18(0, 0, 6) = \frac{I(0, 0, 6)}{I_0(0, 0, 6)} \left\{ \frac{1}{18} \Sigma \frac{I(h, k, l)}{I_0(h, k, l)} \right\}^{-1} \quad (1)$$

[Equation 5]

$$TC18(0, 0, 12) = \frac{I(0, 0, 12)}{I_0(0, 0, 12)} \left\{ \frac{1}{18} \Sigma \frac{I(h, k, l)}{I_0(h, k, l)} \right\}^{-1} \quad (2)$$

As described above, the coating layer in the coated cutting tool of the present embodiment includes at least one α-type aluminum oxide layer. In the α-type aluminum oxide layer, when regarding a texture coefficient of a (0,1,14) plane, which is represented by formula (3) below, as being denoted as a TC18 (0,1,14), if the TC18 (0,1,14) is the third highest texture coefficient, this leads to further excellent wear resistance and thermal shock resistance. It is more preferable for the α-type aluminum oxide layer to have preferential orientation of a (0,1,14) plane because this leads to excellent wear resistance and thermal shock resistance. It should be noted, however, that such preferential orientation of a (0,1,14) plane provides a slightly lower contribution to wear resistance and thermal shock resistance than that seen in each of the case of preferential orientation of a (0,0,6) plane and the case of preferential orientation of a (0,0,12) plane. If the TC18 (0,1,14) of the α-type aluminum oxide layer is the third highest texture coefficient, most of the α-type aluminum oxide layer will be constituted by particles each having preferential orientation of any of a (0,0,6) plane, a (0,0,12) plane and a (0,1,14) plane. This is more preferred because the wear resistance and thermal shock resistance of the coated cutting tool can be exerted to the maximum.

[Equation 6]

$$TC18(0, 1, 14) = \frac{I(0, 1, 14)}{I_0(0, 0, 14)} \left\{ \frac{1}{18} \Sigma \frac{I(h, k, l)}{I_0(h, k, l)} \right\}^{-1} \quad (3)$$

It should be noted, however, that, in formulae (1), (2) and (3) above, I (h,k,l) denotes a peak intensity for an (h,k,l) plane in X-ray diffraction of the α-type aluminum oxide layer, $I_0$ (h,k,l) denotes a standard diffraction intensity for the (h,k,l) plane which is indicated on JCPDS Card No. 10-0173 for α-type aluminum oxide, and (h,k,l) refers to the eighteen crystal planes of (0,1,2), (1,0,4), (1,1,0), (0,0,6), (1,1,3), (2,0,2), (0,2,4), (1,1,6), (0,1,8), (2,1,4), (3,0,0), (1,0,10), (0,2,10), (0,0,12), (0,1,14), (2,0,14), (1,1,15) and (1,0,16).

It should be noted that, if the coated cutting tool includes a TiCN layer below (on the substrate side) the α-type aluminum oxide layer, the difference between the 2θ value (77.05°) for a (2,2,2) plane of the TiCN layer and the 2θ value (76.88°) for a (1,0,10) plane of the α-type aluminum oxide layer is 0.17°, and thus, it is difficult to achieve separate X-ray diffraction peaks for the two planes. Therefore, utilizing the fact that a (2,2,2) plane of the TiCN layer has the same crystalline structure as that of a (1,1,1) plane thereof, the peak intensity for the (2,2,2) plane of the TiCN layer in X-ray diffraction may be obtained via formula (4) below, and then the peak intensity for a (1,0,10) plane of the α-type aluminum oxide layer may be obtained via formula (5) below by subtracting the value of the obtained peak intensity from a peak intensity I (76.9°) in X-ray diffraction, which is close to 76.9° as an actual measured value.

More specifically, the peak intensity for a (1,0,10) plane of the α-type aluminum oxide layer in X-ray diffraction can be obtained, as set forth below. The standard X-ray diffraction intensity $I_0$ (h,k,l) of TiCN is calculated using the value of an (h,k,l) plane of a TiC layer and the value of an (h,k,l) plane of a TiN layer. JCPDS Card No. 32-1383 shows that the standard diffraction intensity for a (1,1,1) plane of TiC (hereinafter referred to as an $I_0$ (1,1,1) of TiC) is 80 and that the standard diffraction intensity for a (2,2,2) plane of TiC (hereinafter referred to as an $I_0$ (2,2,2) of TiC) is 17. JCPDS Card No. 38-1420 shows that the standard diffraction intensity for a (1,1,1) plane of TiN (hereinafter referred to as an $I_0$ (1,1,1) of TiN) is 72 and that the standard diffraction intensity for a (2,2,2) plane of TiN (hereinafter referred to as an $I_0$ (2,2,2) of TiN) is 12. At this time, the atomic ratio between carbon and nitrogen [C:N] contained in a TiCN layer is set at C:N=0.5:0.5, and the standard diffraction intensity for a (1,1,1) plane of TiCN (hereinafter referred to as an $I_0$ (1,1,1) of TiCN) is regarded as the average value of the $I_0$ (1,1,1) of TiC and the $I_0$ (1,1,1) of TiN. Similarly, the standard diffraction intensity for a (2,2,2) plane of TiCN (hereinafter referred to as an $I_0$ (2,2,2) of TiCN) is regarded as the average value of the $I_0$ (2,2,2) of TiC and the $I_0$ (2,2,2) of TiN. Accordingly, the standard diffraction intensities for the respective crystal planes of TiCN are as set forth below.

$I_0$ (1,1,1) of TiCN=76
$I_0$ (2,2,2) of TiCN=14.5

The obtained $I_0$ (1,1,1) of TiCN and the obtained $I_0$ (2,2,2) thereof are substituted into formula (4) below so as to obtain the peak intensity for a (2,2,2) plane of the TiCN layer in X-ray diffraction, and then formula (5) below is used to obtain the peak intensity for a (1,0,10) plane of the α-type aluminum oxide layer in X-ray diffraction.

[Equation 7]

$$\text{TiCN}I(2,2,2) = \text{TiCN}I(1,1,1) \times \frac{I_0(2,2,2) \text{ of TiCN}}{I_0(1,1,1) \text{ of TiCN}} \quad (4)$$

$$= \text{TiCN}I(1,1,1) \times \frac{14.5}{76}$$

[Equation 8]

$$I(1,0,10) \text{ of } \alpha\text{-type aluminum oxide} = I(76.9°) - [\text{TiCN}I(2,2,2)] \quad (5)$$

It is preferable for the TC18 (0,0,6) of the α-type aluminum oxide layer to be the highest texture coefficient and to be from 7.50 or more to 14.00 or less because this leads to an improvement in the thermal shock resistance of the coated cutting tool. If the TC18 (0,0,6) of the α-type aluminum oxide layer is 7.50 or more, this indicates the tendency of the thermal shock resistance to be further improved. Meanwhile, from the perspective of ease of manufacturing of the coated cutting tool, the TC18 (0,0,6) of the α-type aluminum oxide layer is preferably 14.00 or less.

It is preferable for the TC18 (0,0,12) of the α-type aluminum oxide layer to be the second highest texture coefficient and to be from 2.00 or more to 5.00 or less because this leads to an improvement in the wear resistance of the coated cutting tool. If the TC18 (0,0,12) of the α-type aluminum oxide layer is 2.00 or more, this indicates the tendency of the wear resistance to be further improved. Meanwhile, if the TC18 (0,0,12) of the α-type aluminum oxide layer is 5.00 or less, this indicates the tendency of the TC18 (0,0,6) to be relatively higher, thereby easily leading to a further improvement of thermal shock resistance.

It is preferable for the TC18 (0,1,14) of the α-type aluminum oxide layer to be the third highest texture coefficient and to be from 0.80 or more to 2.50 or less because this provides a further excellent balance between wear resistance and thermal shock resistance in the coated cutting tool. If the TC18 (0,1,14) of the α-type aluminum oxide layer is 0.80 or more, this indicates the tendency of the ratio of the particles each having preferential orientation of any of the planes other than a (0,0,6) plane, a (0,0,12) plane and a (0,1,14) plane to be relatively low, thereby leading to a further improvement of wear resistance or thermal shock resistance. Meanwhile, if the TC18 (0,1,14) of the α-type aluminum oxide layer is 2.50 or less, this indicates the tendency of the TC18 (0,0,6) or the TC18 (0,0,12) to be relatively high, thereby easily leading to a further improvement of wear resistance or thermal shock resistance.

In the coated cutting tool of the present embodiment, the average thickness of the α-type aluminum oxide layer is preferably from 1.0 μm or more to 15 μm or less. If the average thickness of the α-type aluminum oxide layer is 1.0 μm or more, this indicates the tendency of the crater wear resistance in the rake surface to be further increased, and if such average thickness is 15 μm or less, this further suppresses the peeling of the α-type aluminum oxide layer, thereby resulting in the tendency of the fracture resistance to be further improved.

As to the peak intensity of each plane index of the α-type aluminum oxide layer, such peak intensity can be measured using a commercially available X-ray diffractometer. For instance, when performing an X-ray diffraction measurement, with an X-ray diffractometer (product name "RINT TTR III") manufactured by Rigaku Corporation, by means of a 2θ/θ focusing optical system with Cu-Kα radiation under the following conditions, the peak intensities of all the plane indices indicated on JCPDS Card No. 10-0173 can be measured. Herein, the measurement conditions are as set forth below: an output: 50 kV, 250 mA; an incident-side solar slit: 5°; a divergence longitudinal slit: ⅔°; a divergence longitudinal limit slit: 5 mm; a scattering slit: ⅔°; a light-receiving side solar slit: 5°; a light-receiving slit: 0.3 mm; a BENT monochromater; a light-receiving monochrome slit: 0.8 mm; a sampling width: 0.01°; a scan speed: 4°/min; and a 2θ measurement range: 20°-155°. When obtaining the above peak intensity of each plane index from an X-ray diffraction pattern, analysis software included with the X-ray diffractometer may be used. With such analysis software, background processing and Kα2 peak removal are conducted using cubic spline, and profile fitting is conducted using Pearson-VII function, whereby each peak intensity can be obtained. It should be noted that, when the Ti compound layer is formed so as to be closer to the substrate than the α-type aluminum oxide layer, each peak intensity can be measured by a thin-film X-ray diffraction method in order to avoid the influence of the Ti compound layer. Further, when the various layers are formed so as to be located further outward than the α-type aluminum oxide layer (on the opposite side to the substrate), the various layers may be removed via buffing, and then an X-ray diffraction measurement may be performed.

The coating layer in the coated cutting tool of the present embodiment preferably comprises at least one Ti compound layer because this leads to further improvements of wear resistance and adhesion. The Ti compound layer is preferably provided between the substrate and the α-type aluminum oxide layer, and the Ti compound layer is also preferably provided further outward than the α-type aluminum oxide layer (on the opposite side to the substrate). In particular, the Ti compound layer is preferably formed in a direct manner on the substrate surface as this will improve the adhesion between the substrate and the coating layer. Further, the Ti compound layer is preferably formed as the outermost layer of the coating cutting tool as this will make it easier to identify a spent corner (i.e., a spent cutting edge portion). The Ti compound layer refers to a compound layer containing a Ti element, as an essential component thereof, and further containing an element of at least one kind selected from the group consisting of C, N, O and B. The Ti compound layer may also contain, as an optional component, an element of at least one kind selected from the group consisting of Zr, Hf, V, Nb, Ta, Cr, Mo, W, Al and Si.

The average thickness of the Ti compound layer in the coated cutting tool of the present embodiment is preferably from 2 μm or more to 15 μm or less. If the average thickness of the Ti compound layer is 2 μm or more, this indicates the tendency of the wear resistance to be improved, and if the average thickness of the Ti compound layer is 15 μm or less, this indicates the tendency of the fracture resistance to be improved. It should be noted that, when the Ti compound layer is formed further outward than the α-type aluminum oxide layer (on the opposite side to the substrate), the average thickness of the Ti compound layer refers to the average thickness of the total of the layer formed below (on the substrate side) the α-type aluminum oxide layer and the layer formed further outward than the α-type aluminum oxide layer (on the opposite side to the substrate).

Examples of a method of forming layers that constitute a coating layer in a coated cutting tool according to the present embodiment include the method set forth below.

For instance, a TiN layer can be formed by chemical vapor deposition with a raw material gas composition of $TiCl_4$: from 5.0 mol % or more to 10.0 mol % or less, $N_2$: from 20 mol % or more to 60 mol % or less, and $H_2$: the balance, a temperature of from 850° C. or higher to 920° C. or lower, and a pressure of from 100 hPa or higher to 350 hPa or lower.

A TiCN layer can be formed by chemical vapor deposition with a raw material gas composition of $TiCl_4$: from 10 mol % or more to 15 mol % or less, $CH_3CN$: from 1 mol % or more to 3 mol % or less, $N_2$: from 0 mol % or more to 20 mol % or less, and $H_2$: the balance, a temperature of from 850° C. or higher to 920° C. or lower, and a pressure of from 60 hPa or higher to 80 hPa or lower.

A TiC layer can be formed by chemical vapor deposition with a raw material gas composition of $TiCl_4$: from 1.0 mol % or more to 3.0 mol % or less, $CH_4$: from 4.0 mol % or more to 6.0 mol % or less, and $H_2$: the balance, a temperature of from 990° C. or higher to 1,030° C. or lower, and a pressure of from 50 hPa or higher to 100 hPa or lower.

A TiAlCNO layer can be formed by chemical vapor deposition with a raw material gas composition of $TiCl_4$: from 3.0 mol % or more to 5.0 mol % or less, $AlCl_3$: from 1.0 mol % or more to 2.0 mol % or less, CO: from 0.4 mol % or more to 1.0 mol % or less, $N_2$: from 30 mol % or more to 40 mol % or less, and $H_2$: the balance, a temperature of from 975° C. or higher to 1,025° C. or lower, and a pressure of from 90 hPa or higher to 110 hPa or lower.

A TiCNO layer can be formed by chemical vapor deposition with a raw material gas composition of $TiCl_4$: from 3.0 mol % or more to 5.0 mol % or less, CO: from 0.4 mol % or more to 1.0 mol % or less, $N_2$: from 30 mol % or more to 40 mol % or less, and $H_2$: the balance, a temperature of from 975° C. or higher to 1,025° C. or lower, and a pressure of from 90 hPa or higher to 110 hPa or lower.

A TiCO layer can be formed by chemical vapor deposition with a raw material gas composition of $TiCl_4$: from 0.5 mol % or more to 1.5 mol % or less, CO: from 2.0 mol % or more to 4.0 mol % or less, and $H_2$: the balance, a temperature of from 975° C. or higher to 1,025° C. or lower, and a pressure of from 60 hPa or higher to 100 hPa or lower.

In the present embodiment, a coated cutting tool which involves the controlled crystal orientation of an α-type aluminum oxide layer can be obtained by, for example, the method set forth below.

A coating layer according to the present embodiment can be obtained by forming a Ti compound layer on a surface of a substrate, if necessary, and then forming a nucleus of aluminum oxide on the substrate or the Ti compound layer. The nucleus of aluminum oxide is formed with a very small amount of CO gas being caused to flow at a low temperature. This leads to the formation of the nucleus of aluminum oxide at a very slow rate. Further, the nucleus of aluminum oxide is minute, and such minute nucleus of aluminum oxide can cover the surface of the substrate or the surface of the Ti compound layer. Thereafter, an α-type aluminum oxide layer is formed with normal conditions, thereby making it possible to obtain an α-type aluminum oxide layer involving a TC18 (0,0,6) as the highest texture coefficient.

In order to obtain an α-type aluminum oxide layer involving a TC18 (0,0,6) as the highest texture coefficient and a TC18 (0,0,12) as the second highest texture coefficient, the following procedure may be employed. That is, the same procedure as above is employed until a nucleus of aluminum oxide is formed, and then the α-type aluminum oxide layer may be formed under the conditions that: the deposition temperature is raised; and a Co gas is not caused to flow. At this time, the time during which the α-type aluminum oxide layer is formed under the conditions that: the deposition temperature is raised; and a Co gas is not caused to flow, is preferably from 2 minutes or more to less than 5 minutes. Thus, the α-type aluminum oxide layer is prone to have preferential orientation of a (0,0,6) plane and a (0,0,12) plane. Then, the α-type aluminum oxide layer may be formed with normal conditions.

In order to obtain an α-type aluminum oxide layer involving a TC18 (0,0,6) as the highest texture coefficient, a TC18 (0,0,12) as the second highest texture coefficient and a TC18 (0,1,14) as the third highest texture coefficient, the following procedure may be employed. That is, the same procedure as above is employed until a nucleus of aluminum oxide is formed, and then the α-type aluminum oxide layer may be formed for 5 minutes or more and less than 8 minutes under the conditions that: the deposition temperature is raised; and a Co gas is not caused to flow. Thus, the α-type aluminum oxide layer is prone to have preferential orientation of a (0,0,6) plane, a (0,0,12) plane and a (0,1,14) plane. Then, the α-type aluminum oxide layer may be formed with normal conditions.

More specifically, an α-type aluminum oxide layer according to the present embodiment can be obtained through steps (A), (B) and (C) set forth below.

In step (A), a nucleus of aluminum oxide (hereinafter also referred to as "$Al_2O_3$") is formed. Such nucleus of $Al_2O_3$ is formed by chemical vapor deposition with a raw material gas composition of $AlCl_3$: from 1.0 mol % or more to 4.0 mol % or less, CO: from 0.05 mol % or more to 2.0 mol % or less, $CO_2$: from 1.0 mol % or more to 3.0 mol % or less, HCl: from 2.0 mol % or more to 3.0 mol % or less, and $H_2$: the balance, a temperature of from 880° C. or higher to 930° C. or lower, and a pressure of from 60 hPa or higher to 80 hPa or lower.

In step (B), a nucleus of $Al_2O_3$ is formed which is different from the nucleus formed in step (A). Such nucleus of $Al_2O_3$ is formed by chemical vapor deposition with a raw material gas composition of $AlCl_3$: from 1.0 mol % or more to 3.0 mol % or less, $CO_2$: from 1.0 mol % or more to 3.0 mol % or less, HCl: from 2.0 mol % or more to 3.0 mol % or less, and $H_2$: the balance, a temperature of from 920° C. or higher to 990° C. or lower, and a pressure of from 60 hPa or higher to 80 hPa or lower. At this time, if the time during which the nucleus of $Al_2O_3$ is formed is from 2 minutes or more to less than 5 minutes, this makes it possible to more reliably obtain an α-type aluminum oxide layer involving a TC18 (0,0,6) as the highest texture coefficient and a TC18 (0,0,12) as the second highest texture coefficient. Further, if the time during which the nucleus of $Al_2O_3$ is formed is from 5 minutes or more to less than 8 minutes, this makes it possible to more reliably obtain an α-type aluminum oxide layer involving a TC18 (0,0,6) as the highest texture coefficient, a TC18 (0,0,12) as the second highest texture coefficient and a TC18 (0,1,14) as the third highest texture coefficient.

In step (C), an α-type aluminum oxide layer (hereinafter also referred to as an "α-type $Al_2O_3$ layer") is formed. Such α-type aluminum oxide layer can be formed by chemical vapor deposition with a raw material gas composition of $AlCl_3$: from 2.0 mol % or more to 5.0 mol % or less, $CO_2$: from 2.5 mol % or more to 4.0 mol % or less, HCl: from 2.0 mol % or more to 3.0 mol % or less, $H_2S$: from 0.15 mol % or more to 0.25 mol % or less, and $H_2$: the balance, a temperature of from 950° C. or higher to 1,000° C. or lower, and a pressure of from 60 hPa or higher to 80 hPa or lower.

The thickness of each layer in the coated cutting tool of the present embodiment can be measured by observing a cross-sectional structure of the coated cutting tool, using an optical microscope, a scanning electron microscope (SEM), a field emission scanning electron microscope (FE-SEM) or the like. It should be noted that, the average thickness of each layer in the coated cutting tool can be obtained by: measuring the thickness of each layer at three or more locations near the position 50 μm from the edge, toward the center of the rake surface of the coated cutting tool; and calculating the arithmetic mean of the resulting measurements. The composition of each layer can be measured from a cross-sectional structure of the coated cutting tool of the present embodiment, using an energy-dispersive X-ray spectroscope (EDS), a wavelength-dispersive X-ray spectroscope (WDS) or the like.

EXAMPLES

Although the present invention will be described in further detail below, with examples, the present invention is not limited to such examples.

A cemented carbide cutting insert with a shape of JIS standard CNMG120412 and a composition of 93.1 WC-6.5Co-0.4$Cr_3C_2$ (mass %) was prepared as a substrate. The edge of such substrate was subjected to round honing by means of an SiC brush, and the surface of the substrate was then washed.

After the surface of the substrate was washed, with regard to invention samples 1 to 10, firstly, the substrate was inserted into an external heating chemical vapor deposition apparatus, and a Ti compound layer (in the order of a first layer, a second layer and a third layer from the substrate side), whose composition is shown in Table 5, was formed on the substrate surface so as to have the respective average thicknesses shown in Table 5 under the conditions shown in Table 4. Then, a nucleus of $Al_2O_3$ was formed on the surface of the Ti compound layer under the conditions shown in Table 1. Thereafter, an α-type $Al_2O_3$ layer was formed on the surface of the Ti compound layer and the surface of the nucleus of $Al_2O_3$ so as to have the average thickness shown in Table 5 under the conditions shown in Table 2. As a result, the samples of coated cutting tools were obtained.

After the surface of the substrate was washed, with regard to comparative samples 1 to 10, firstly, the substrate was inserted into an external heating chemical vapor deposition apparatus, and a Ti compound layer (in the order of a first layer, a second layer and a third layer from the substrate side), whose composition is shown in Table 5, was formed on the substrate surface so as to have the respective average thicknesses shown in Table 5 under the conditions shown in Table 4. Then, a nucleus of $Al_2O_3$ was formed on the surface of the Ti compound layer under the conditions shown in Table 3. Thereafter, an α-type $Al_2O_3$ layer was formed on the surface of the Ti compound layer and the surface of the nucleus of $Al_2O_3$ so as to have the average thickness shown in Table 5 under the conditions shown in Table 4. As a result, the samples of coated cutting tools were obtained.

The thickness of each layer of each of the obtained samples was obtained as set forth below. That is, using an FE-SEM, the average thickness was obtained by: measuring the thickness of each layer, from each of the cross-sectional surfaces at three locations near the position 50 μm from the edge of the coated cutting tool, toward the center of the rake surface thereof; and calculating the arithmetic mean of the resulting measurements. Using an EDS, the composition of each layer of the obtained sample was measured from the cross-sectional surface near the position 50 μm from the edge of the coated cutting tool, toward the center of the rake surface thereof.

TABLE 1

| | Step (A) | | | Step (B) | | | |
|---|---|---|---|---|---|---|---|
| Sample No. | Temperature (° C.) | Pressure (hPa) | Raw material gas composition (mol %) | Temperature (° C.) | Pressure (hPa) | Raw material gas composition (mol %) | Time (min) |
| Invention sample 1 | 880 | 70 | $AlCl_3$: 2.2%, CO: 1.5%, $CO_2$: 3.0%, HCl: 2.5%, $H_2$: 90.8% | 970 | 70 | $AlCl_3$: 1.5%, $CO_2$: 2.5%, HCl: 2.0%, $H_2$: 94.0% | 7 |

TABLE 1-continued

| | Step (A) | | | Step (B) | | | |
|---|---|---|---|---|---|---|---|
| Sample No. | Temperature (° C.) | Pressure (hPa) | Raw material gas composition (mol %) | Temperature (° C.) | Pressure (hPa) | Raw material gas composition (mol %) | Time (min) |
| Invention sample 2 | 880 | 60 | $AlCl_3$: 2.5%, CO: 1.5%, $CO_2$: 3.0%, HCl: 2.0%, $H_2$: 91.0% | 970 | 60 | $AlCl_3$: 2.2%, $CO_2$: 2.0%, HCl: 3.0%, $H_2$: 92.8% | 6 |
| Invention sample 3 | 900 | 70 | $AlCl_3$: 3.0%, CO: 1.5%, $CO_2$: 2.5%, HCl: 2.5%, $H_2$: 90.5% | 940 | 70 | $AlCl_3$: 3.0%, $CO_2$: 2.0%, HCl: 2.5%, $H_2$: 92.5% | 6 |
| Invention sample 4 | 900 | 70 | $AlCl_3$: 2.5%, CO: 1.5%, $CO_2$: 3.0%, HCl: 2.0%, $H_2$: 91.0% | 940 | 70 | $AlCl_3$: 2.2%, $CO_2$: 1.5%, HCl: 2.5%, $H_2$: 93.8% | 6 |
| Invention sample 5 | 930 | 70 | $AlCl_3$: 1.5%, CO: 2.0%, $CO_2$: 2.5%, HCl: 2.0%, $H_2$: 92.0% | 970 | 70 | $AlCl_3$: 2.2%, $CO_2$: 2.0%, HCl: 3.0%, $H_2$: 92.8% | 5 |
| Invention sample 6 | 930 | 70 | $AlCl_3$: 2.2%, CO: 1.0%, $CO_2$: 2.8%, HCl: 2.5%, $H_2$: 91.5% | 970 | 70 | $AlCl_3$: 2.2%, $CO_2$: 2.0%, HCl: 2.0%, $H_2$: 93.8% | 6 |
| Invention sample 7 | 900 | 70 | $AlCl_3$: 2.5%, CO: 1.5%, $CO_2$: 3.0%, HCl: 2.0%, $H_2$: 91.0% | 990 | 70 | $AlCl_3$: 2.2%, $CO_2$: 1.5%, HCl: 2.5%, $H_2$: 93.8% | 6 |
| Invention sample 8 | 900 | 70 | $AlCl_3$: 2.5%, CO: 1.5%, $CO_2$: 3.0%, HCl: 2.0%, $H_2$: 91.0% | 990 | 70 | $AlCl_3$: 2.7%, $CO_2$: 1.0%, HCl: 2.5%, $H_2$: 93.8% | 7 |
| Invention sample 9 | 900 | 70 | $AlCl_3$: 2.5%, CO: 1.5%, $CO_2$: 3.0%, HCl: 2.0%, $H_2$: 91.0% | 970 | 70 | $AlCl_3$: 2.2%, $CO_2$: 1.5%, HCl: 2.5%, $H_2$: 93.8% | 2 |
| Invention sample 10 | 900 | 80 | $AlCl_3$: 2.5%, CO: 1.5%, $CO_2$: 3.0%, HCl: 2.0%, $H_2$: 91.0% | 970 | 80 | $AlCl_3$: 2.7%, $CO_2$: 1.0%, HCl: 2.5%, $H_2$: 93.8% | 2 |

TABLE 2

| | Step (C) | | |
|---|---|---|---|
| Sample No. | Temperature (° C.) | Pressure (hPa) | Raw material gas composition (mol %) |
| Invention sample 1 | 1,000 | 70 | $AlCl_3$: 2.5%, $CO_2$: 3.3%, HCl: 2.5%, $H_2S$: 0.25%, $H_2$: 91.45% |
| Invention sample 2 | 970 | 70 | $AlCl_3$: 2.5%, $CO_2$: 3.3%, HCl: 2.5%, $H_2S$: 0.25%, $H_2$: 91.45% |
| Invention sample 3 | 970 | 60 | $AlCl_3$: 2.1%, $CO_2$: 3.3%, HCl: 2.5%, $H_2S$: 0.2%, $H_2$: 91.9% |
| Invention sample 4 | 970 | 70 | $AlCl_3$: 2.3%, $CO_2$: 3.3%, HCl: 2.5%, $H_2S$: 0.2%, $H_2$: 91.7% |
| Invention sample 5 | 950 | 70 | $AlCl_3$: 4.0%, $CO_2$: 2.5%, HCl: 2.5%, $H_2S$: 0.2%, $H_2$: 90.8% |
| Invention sample 6 | 970 | 70 | $AlCl_3$: 2.3%, $CO_2$: 3.3%, HCl: 2.5%, $H_2S$: 0.2%, $H_2$: 91.7% |
| Invention sample 7 | 950 | 70 | $AlCl_3$: 2.3%, $CO_2$: 3.3%, HCl: 2.5%, $H_2S$: 0.2%, $H_2$: 91.7% |
| Invention sample 8 | 1,000 | 80 | $AlCl_3$: 3.5%, $CO_2$: 3.0%, HCl: 3.0%, $H_2S$: 0.2%, $H_2$: 90.3% |
| Invention sample 9 | 1,000 | 70 | $AlCl_3$: 2.3%, $CO_2$: 3.3%, HCl: 2.5%, $H_2S$: 0.2%, $H_2$: 91.7% |
| Invention sample 10 | 970 | 70 | $AlCl_3$: 2.3%, $CO_2$: 3.3%, HCl: 2.5%, $H_2S$: 0.2%, $H_2$: 91.7% |

TABLE 3

| | Nucleus of $Al_2O_3$ | | |
|---|---|---|---|
| Sample No. | Temperature (° C.) | Pressure (hPa) | Raw material gas composition (mol %) |
| Comparative sample 1 | 880 | 70 | $AlCl_3$: 2.2%, CO: 1.5%, $CO_2$: 3.3%, HCl: 2.5%, $H_2$: 90.5% |
| Comparative sample 2 | 880 | 60 | $AlCl_3$: 2.5%, CO: 1.5%, $CO_2$: 3.0%, HCl: 2.5%, $H_2$: 91.0% |
| Comparative sample 3 | 900 | 70 | $AlCl_3$: 3.0%, CO: 1.5%, $CO_2$: 2.5%, HCl: 2.5%, $H_2$: 90.5% |
| Comparative sample 4 | 900 | 70 | $AlCl_3$: 2.5%, CO: 1.5%, $CO_2$: 3.0%, HCl: 2.0%, $H_2$: 91.0% |
| Comparative sample 5 | 930 | 70 | $AlCl_3$: 1.5%, CO: 2.0%, $CO_2$: 2.5%, HCl: 2.0%, $H_2$: 92.0% |
| Comparative sample 6 | 930 | 70 | $AlCl_3$: 2.2%, CO: 1.0%, $CO_2$: 2.8%, HCl: 2.5%, $H_2$: 91.5% |
| Comparative sample 7 | 900 | 70 | $AlCl_3$: 2.5%, CO: 1.5%, $CO_2$: 3.0%, HCl: 2.0%, $H_2$: 91.0% |
| Comparative sample 8 | 970 | 70 | $AlCl_3$: 4.7%. $CO_2$: 3.3%, HCl: 2.0%, $H_2S$: 0.3%, $H_2$: 89.7% |
| Comparative sample 9 | | | No formation of a nucleus |
| Comparative sample 10 | | | No formation of a nucleus |

TABLE 4

| Coating layer type | Temperature (° C.) | Pressure (hPa) | Raw material gas composition (mol %) |
|---|---|---|---|
| α-type $Al_2O_3$ (Comparative samples 1-8) | 1,000 | 70 | $AlCl_3$: 2.7%, $CO_2$: 3.3%, HCl: 2.5%, $H_2S$: 0.3%, $H_2$: 91.2% |
| α-type $Al_2O_3$ (Comparative sample 9) | 1,000 | 70 | $AlCl_3$: 4.5%, $CO_2$: 2.0%, HCl: 2.5%, $H_2S$: 0.5%, Ar: 15.0%, $H_2$: 75.5% |
| α-type $Al_2O_3$ (Comparative sample 10) | 950 | 70 | $AlCl_3$: 7.0%, $CO_2$: 1.1%, HCl: 1.5%, $H_2S$: 0.5%, $H_2$: 89.9% |
| TiN | 900 | 400 | $TiCl_4$: 7.5%, $N_2$: 40%, $H_2$: 52.5% |
| TiC | 1,000 | 75 | $TiCl_4$: 2.4%, $CH_4$: 4.6%, $H_2$: 93% |
| TiCN | 800 | 75 | $TiCl_4$: 3.0%, $CH_3CN$: 0.3%, $H_2$: 96.7% |
| TiCNO | 1,000 | 100 | $TiCl_4$: 3.5%, CO: 0.7%, $N_2$: 35.5%, $H_2$: 60.3% |
| TiAlCNO | 1,000 | 100 | $TiCl_4$: 3.8%, $AlCl_3$: 1.5%, CO: 0.7%, $N_2$: 35.2%, $H_2$: 58.8% |
| TiCO | 1,000 | 80 | $TiCl_4$: 1.3%, CO: 2.7%, $H_2$: 96% |

TABLE 5

| | Coating layer | | | | | | | |
|---|---|---|---|---|---|---|---|---|
| | Ti compound layer | | | | | | α-type Al$_2$O$_3$ layer | |
| | First layer | | Second layer | | Third layer | | Average thickness of entire Ti compound layer (μm) | |
| Sample No. | Composition | Average thickness (μm) | Composition | Average thickness (μm) | Composition | Average thickness (μm) | | Average thickness (μm) | Total thickness (μm) |
| Invention sample 1 | TiN | 0.3 | TiCN | 7.0 | TiCO | 0.5 | 7.8 | 5.0 | 12.8 |
| Invention sample 2 | TiN | 0.5 | TiCN | 5.0 | TiCNO | 0.5 | 6.0 | 10.0 | 16.0 |
| Invention sample 3 | TiN | 0.2 | TiCN | 14.0 | TiAlCNO | 0.2 | 14.4 | 3.0 | 17.4 |
| Invention sample 4 | TiN | 0.3 | TiCN | 17.0 | TiAlCNO | 0.3 | 17.6 | 8.0 | 25.6 |
| Invention sample 5 | TiN | 0.2 | TiCN | 7.0 | TiCNO | 0.3 | 7.5 | 15.0 | 22.5 |
| Invention sample 6 | TiC | 0.2 | TiCN | 7.0 | TiCNO | 0.2 | 7.4 | 12.0 | 19.4 |
| Invention sample 7 | TiC | 1.0 | TiCN | 10.0 | TiCNO | 0.2 | 11.2 | 5.0 | 16.2 |
| Invention sample 8 | TiN | 1.0 | TiCN | 2.0 | TiAlCNO | 0.1 | 3.1 | 5.0 | 8.1 |
| Invention sample 9 | TiN | 0.3 | TiCN | 5.0 | TiCNO | 0.5 | 5.8 | 7.0 | 12.8 |
| Invention sample 10 | TiN | 0.5 | TiCN | 10.0 | TiCNO | 0.5 | 11.0 | 5.0 | 16.0 |
| Comparative sample 1 | TiN | 0.3 | TiCN | 5.0 | TiCNO | 0.5 | 5.8 | 5.0 | 10.8 |
| Comparative sample 2 | TiN | 0.3 | TiCN | 8.0 | TiAlCNO | 0.2 | 8.5 | 9.0 | 17.5 |
| Comparative sample 3 | TiC | 0.3 | TiCN | 5.0 | TiCNO | 0.2 | 5.5 | 2.0 | 7.5 |
| Comparative sample 4 | TiC | 0.3 | TiCN | 15.0 | TiCO | 0.2 | 15.5 | 7.0 | 22.5 |
| Comparative sample 5 | TiN | 0.2 | TiCN | 18.0 | TiCNO | 0.3 | 18.5 | 5.0 | 23.5 |
| Comparative sample 6 | TiN | 0.2 | TiCN | 2.0 | TiAlCNO | 0.5 | 2.7 | 15.0 | 17.7 |
| Comparative sample 7 | TiN | 0.2 | TiCN | 11.0 | TiAlCNO | 0.5 | 11.7 | 10.0 | 21.7 |
| Comparative sample 8 | TiN | 0.3 | TiCN | 5.0 | TiCNO | 0.1 | 5.4 | 10.0 | 15.4 |
| Comparative sample 9 | TiN | 1.0 | TiCN | 7.0 | TiCO | 0.2 | 8.2 | 8.0 | 16.2 |
| Comparative sample 10 | TiN | 1.0 | TiCN | 10.0 | TiCNO | 0.2 | 11.2 | 8.0 | 19.2 |

As to the obtained samples, an X-ray diffraction measurement by means of a 2θ/θ focusing optical system with Cu-Kα radiation was performed under the following conditions: an output: 50 kV, 250 mA; an incident-side solar slit: 5°; a divergence longitudinal slit: ⅔°; a divergence longitudinal limit slit: 5 mm; a scattering slit: ⅔°; a light-receiving side solar slit: 5°; a light-receiving slit: 0.3 mm; a BENT monochromater; a light-receiving monochrome slit: 0.8 mm; a sampling width: 0.01°; a scan speed: 4°/min; and a 2θ measurement range: 20°-155°. As to the apparatus, an X-ray diffractometer (model "RINT TTR III") manufactured by Rigaku Corporation was used. The peak intensity of each plane index of the α-type aluminum oxide layer was obtained from an X-ray diffraction pattern. A TC18 (h,k,l) was obtained from the resulting peak intensity of each plane index. The resultant TC18 (h,k,l) values were used to determine the crystal plane involving the highest texture coefficient, the crystal plane involving the second highest texture coefficient and the crystal plane involving the third highest texture coefficient. The results are shown in Table 6. The TC18 (0,0,6) values, TC18 (0,0,12) values and TC18 (0,1,14) values are also shown in Table 6.

TABLE 6

| | α-type Al$_2$O$_3$ layer | | | | | |
|---|---|---|---|---|---|---|
| Sample No. | Crystal plane involving the highest texture coefficient | Crystal plane involving the second highest texture coefficient | Crystal plane involving the third highest texture coefficient | TC18 (0, 0, 6) | TC18 (0, 0, 12) | TC18 (0, 1, 14) |
| Invention sample 1 | (0, 0, 6) | (0, 0, 12) | (0, 1, 14) | 10.25 | 3.61 | 1.90 |

TABLE 6-continued

| | α-type Al$_2$O$_3$ layer | | | | | |
|---|---|---|---|---|---|---|
| Sample No. | Crystal plane involving the highest texture coefficient | Crystal plane involving the second highest texture coefficient | Crystal plane involving the third highest texture coefficient | TC18 (0, 0, 6) | TC18 (0, 0, 12) | TC18 (0, 1, 14) |
| Invention sample 2 | (0, 0, 6) | (0, 0, 12) | (0, 1, 14) | 12.34 | 3.42 | 1.52 |
| Invention sample 3 | (0, 0, 6) | (0, 0, 12) | (0, 1, 14) | 10.78 | 4.37 | 1.72 |
| Invention sample 4 | (0, 0, 6) | (0, 0, 12) | (0, 1, 14) | 11.79 | 3.57 | 1.54 |
| Invention sample 5 | (0, 0, 6) | (0, 0, 12) | (0, 1, 14) | 13.48 | 3.80 | 1.02 |
| Invention sample 6 | (0, 0, 6) | (0, 0, 12) | (0, 1, 14) | 12.27 | 2.71 | 1.24 |
| Invention sample 7 | (0, 0, 6) | (0, 0, 12) | (0, 1, 14) | 13.80 | 3.00 | 1.06 |
| Invention sample 8 | (0, 0, 6) | (0, 0, 12) | (0, 1, 14) | 9.35 | 2.81 | 2.33 |
| Invention sample 9 | (0, 0, 6) | (0, 0, 12) | (0, 1, 8) | 10.30 | 2.31 | 1.30 |
| Invention sample 10 | (0, 0, 6) | (0, 0, 12) | (0, 1, 8) | 7.98 | 2.66 | 0.95 |
| Comparative sample 1 | (0, 0, 6) | (1, 2, 11) | (0, 1, 8) | 8.93 | 1.14 | 0.76 |
| Comparative sample 2 | (0, 0, 6) | (1, 2, 11) | (1, 0, 10) | 7.76 | 1.90 | 1.59 |
| Comparative sample 3 | (0, 0, 6) | (1, 2, 11) | (1, 0, 10) | 6.70 | 1.36 | 1.40 |
| Comparative sample 4 | (0, 0, 6) | (1, 0, 10) | (0, 1, 14) | 5.70 | 2.09 | 2.16 |
| Comparative sample 5 | (0, 0, 6) | (0, 1, 8) | (1, 0, 10) | 5.64 | 1.37 | 2.02 |
| Comparative sample 6 | (0, 0, 6) | (1, 2, 11) | (1, 0, 10) | 6.70 | 1.36 | 1.40 |
| Comparative sample 7 | (0, 0, 6) | (0, 1, 8) | (0, 4, 8) | 2.51 | 0.73 | 0.78 |
| Comparative sample 8 | (1, 1, 0) | (0, 0, 6) | (1, 0, 10) | 2.75 | 0.77 | 0.79 |
| Comparative sample 9 | (1, 2, 11) | (0, 1, 8) | (1, 1, 9) | 0.54 | 0.21 | 0.49 |
| Comparative sample 10 | (0, 2, 4) | (0, 1, 2) | (0, 4, 8) | 0.00 | 0.00 | 0.00 |

Cutting tests 1 and 2 were conducted using the obtained samples under the following conditions. Cutting test 1 is a test for evaluating wear resistance, and cutting test 2 is a test for evaluating fracture resistance. The results of the respective cutting tests are shown in Table 7.

[Cutting Test 1]
Workpiece material: S50C round bar
Cutting speed: 300 m/min
Feed: 0.30 mm/rev
Depth of cut: 2.0 mm
Coolant: Used
Evaluation items: A time when a sample was fractured or chipping occurred in a sample, or a sample had a maximum flank wear width of 0.2 mm was defined as the end of the tool life, and the machining time to reach the end of the tool life was measured.

[Cutting Test 2]
Workpiece material: S50C round bar with two equidistant grooves extending in the length direction
Cutting speed: 250 m/min
Feed: 0.40 mm/rev
Depth of cut: 1.5 mm
Coolant: Used
Evaluation items: A time when a sample was fractured was defined as the end of the tool life, and the number of shocks the sample had received until the end of the tool life was measured. The number of times the sample and the workpiece material were brought into contact with each other was defined as the number of shocks, and the test was ended when the number of contacts reached 20,000 at a maximum. In other words, the number "20,000" for the tool life indicates that the end of the tool life was not reached even after the arrival of 20,000 shocks. It should be noted that, as to each sample, five inserts were prepared and the number of shocks was measured for each of such cutting inserts, and the arithmetic mean was obtained from the measurements of the number of shocks so as to serve as the tool life.

TABLE 7

| | Cutting tests | | |
|---|---|---|---|
| | Wear resistance test | | Fracture resistance test |
| Sample No. | Machining time (min) | Damage form | Number of shocks (shocks) |
| Invention sample 1 | 35 | Normal wear | 20,000 |
| Invention sample 2 | 46 | Normal wear | 15,200 |

TABLE 7-continued

| | Cutting tests | | |
|---|---|---|---|
| | Wear resistance test | | Fracture resistance test |
| Sample No. | Machining time (min) | Damage form | Number of shocks (shocks) |
| Invention sample 3 | 38 | Normal wear | 18,700 |
| Invention sample 4 | 36 | Normal wear | 17,400 |
| Invention sample 5 | 43 | Normal wear | 14,200 |
| Invention sample 6 | 41 | Normal wear | 16,500 |
| Invention sample 7 | 33 | Normal wear | 11,000 |
| Invention sample 8 | 32 | Normal wear | 20,000 |
| Invention sample 9 | 35 | Normal wear | 18,600 |
| Invention sample 10 | 30 | Normal wear | 17,400 |
| Comparative sample 1 | 29 | Normal wear | 8,600 |
| Comparative sample 2 | 26 | Normal wear | 9,500 |
| Comparative sample 3 | 12 | Fracturing | 14,500 |
| Comparative sample 4 | 19 | Normal wear | 20,000 |
| Comparative sample 5 | 26 | Chipping | 8,200 |
| Comparative sample 6 | 22 | Fracturing | 13,600 |
| Comparative sample 7 | 20 | Normal wear | 7,200 |
| Comparative sample 8 | 17 | Chipping | 5,600 |
| Comparative sample 9 | 13 | Fracturing | 18,100 |
| Comparative sample 10 | 15 | Fracturing | 3,200 |

Table 7 indicates that the invention samples each involved improvements of wear resistance and fracture resistance. The occurrence of fracturing in the evaluations on fracture resistance can be considered to derive from the thermal shock caused by the use of coolant in high-speed cutting. That is, an improvement of fracture resistance refers to an improvement of thermal shock resistance. It is apparent that each invention sample has a longer machining time to reach the end of the tool life than that of each comparative sample and also involves a larger number of shocks than that of each comparative sample, whereby each invention sample has a significantly long tool life.

The present application is based on the Japanese patent application filed on Feb. 18, 2016 (JP Appl. 2016-028477), the content of which is incorporated herein by reference.

INDUSTRIAL APPLICABILITY

The coated cutting tool according to the present invention has excellent wear resistance and thermal shock resistance, so that the tool life can be extended more than that involved in the prior art, and, from such perspective, the coated cutting tool has industrial applicability.

What is claimed is:

1. A coated cutting tool comprising a substrate and a coating layer formed on a surface of the substrate, wherein: the coating layer comprises at least one α-type aluminum oxide layer; and in the α-type aluminum oxide layer, when regarding a "texture coefficient of a (0,0,6) plane," which is represented by formula (1) below, as being denoted as a "TC18 (0,0,6)," and also regarding a "texture coefficient of a (0,0,12) plane," which is represented by formula (2) below, as being denoted as a "TC18 (0,0,12)," the TC18 (0,0,6) is the highest texture coefficient and the TC18 (0,0,12) is the second highest texture coefficient from among texture coefficients of eighteen crystal planes of the α-type aluminum oxide layer which are set forth below:

[Equation 1]

$$TC18(0, 0, 6) = \frac{I(0, 0, 6)}{I_0(0, 0, 6)} \left\{ \frac{1}{18} \Sigma \frac{I(h, k, l)}{I_0(h, k, l)} \right\}^{-1} \quad (1)$$

[Equation 2]

$$TC18(0, 0, 12) = \frac{I(0, 0, 12)}{I_0(0, 0, 12)} \left\{ \frac{1}{18} \Sigma \frac{I(h, k, l)}{I_0(h, k, l)} \right\}^{-1} \quad (2)$$

(In formulae (1) and (2), I (h,k,l) denotes a peak intensity for an (h,k,l) plane in X-ray diffraction of the α-type aluminum oxide layer, $I_0$ (h,k,l) denotes a standard diffraction intensity for an (h,k,l) plane which is indicated on JCPDS Card No. 10-0173 for α-type aluminum oxide, and (h,k,l) refers to the eighteen crystal planes of (0,1,2), (1,0,4), (1,1,0), (0,0,6), (1,1,3), (2,0,2), (0,2,4), (1,1,6), (0,1,8), (2,1,4), (3,0,0), (1,0,10), (0,2,10), (0,0,12), (0,1,14), (2,0,14), (1,1,15) and (1,0,16)).

2. The coated cutting tool according to claim 1, wherein, in the α-type aluminum oxide layer, when regarding a texture coefficient of a (0,1,14) plane as a TC18 (0,1,14), as represented by formula (3) below, the TC18 (0,1,14) is the third highest texture coefficient from among the coefficients of the eighteen crystal planes of the α-type aluminum oxide layer:

[Equation 3]

$$TC18(0, 1, 14) = \frac{I(0, 1, 14)}{I_0(0, 0, 14)} \left\{ \frac{1}{18} \Sigma \frac{I(h, k, l)}{I_0(h, k, l)} \right\}^{-1} \quad (3)$$

(In formula (3), I (h,k,l), $I_0$ (h,k,l) and (h,k,l) respectively refer to those set forth above with regard to formulae (1) and (2)).

3. The coated cutting tool according to claim 1, wherein the TC18 (0,0,6) is from 7.50 or more to 14.00 or less.

4. The coated cutting tool according to claim 1, wherein the TC18 (0,0,12) is from 2.00 or more to 5.00 or less.

5. The coated cutting tool according to claim 1, wherein the TC18 (0,1,14) is from 0.80 or more to 2.50 or less.

6. The coated cutting tool according to claim 1, wherein an average thickness of the α-type aluminum oxide layer is from 1.0 μm or more to 15 μm or less.

7. The coated cutting tool according to claim 1, wherein the coating layer comprises, between the substrate and the α-type aluminum oxide layer, a Ti compound layer containing a Ti compound of a Ti element and an element of at least one kind selected from the group consisting of C, N, O and B.

8. The coated cutting tool according to claim 7, wherein an average thickness of the Ti compound layer is from 2.0 μm or more to 20 μm or less.

9. The coated cutting tool according to claim 1, wherein an average thickness of the coating layer is from 3.0 μm or more to 30 μm or less.

10. The coated cutting tool according to claim 1, wherein the substrate is a cemented carbide, cermet, ceramic or a cubic boron nitride sintered body.

11. The coated cutting tool according to claim 2, wherein the TC18 (0,0,6) is from 7.50 or more to 14.00 or less.

12. The coated cutting tool according to claim 11, wherein the TC18 (0,0,12) is from 2.00 or more to 5.00 or less.

13. The coated cutting tool according to claim 11, wherein the TC18 (0,1,14) is from 0.80 or more to 2.50 or less.

14. The coated cutting tool according to claim 2, wherein the TC18 (0,0,12) is from 2.00 or more to 5.00 or less.

15. The coated cutting tool according to claim 3, wherein the TC18 (0,0,12) is from 2.00 or more to 5.00 or less.

16. The coated cutting tool according to claim 2, wherein the TC18 (0,1,14) is from 0.80 or more to 2.50 or less.

17. The coated cutting tool according to claim 3, wherein the TC18 (0,1,14) is from 0.80 or more to 2.50 or less.

18. The coated cutting tool according to claim 4, wherein the TC18 (0,1,14) is from 0.80 or more to 2.50 or less.

19. The coated cutting tool according to claim 2, wherein an average thickness of the α-type aluminum oxide layer is from 1.0 μm or more to 15 μm or less.

20. The coated cutting tool according to claim 2, wherein the coating layer comprises, between the substrate and the α-type aluminum oxide layer, a Ti compound layer containing a Ti compound of a Ti element and an element of at least one kind selected from the group consisting of C, N, O and B.

\* \* \* \* \*